(12) United States Patent
Parkinson et al.

(10) Patent No.: US 8,098,512 B2
(45) Date of Patent: *Jan. 17, 2012

(54) READING PHASE CHANGE MEMORIES

(75) Inventors: Ward D. Parkinson, Boise, ID (US);
Giulio Casagrande, Milan (IT);
Claudio Resta, Pavia (IT); Roberto Gastaldi, Agrate Brianza (IT);
Ferdinando Bedeschi, Milan (IT)

(73) Assignee: Ovonyx, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/072,911

(22) Filed: Mar. 28, 2011

(65) Prior Publication Data

US 2011/0176358 A1 Jul. 21, 2011

Related U.S. Application Data

(62) Division of application No. 12/354,425, filed on Jan. 15, 2009, now Pat. No. 7,936,584, which is a division of application No. 11/093,878, filed on Mar. 30, 2005, now Pat. No. 7,495,944.

(51) Int. Cl.
*G11C 11/00* (2006.01)
(52) U.S. Cl. ........................................ 365/148
(58) Field of Classification Search .................. 365/148
See application file for complete search history.

(56) References Cited

U.S. PATENT DOCUMENTS

| 6,687,153 B2 * | 2/2004 | Lowrey ............. 365/163 |
| 2004/0114413 A1 * | 6/2004 | Parkinson et al. ...... 365/100 |
| 2004/0257862 A1 * | 12/2004 | Anthony et al. ....... 365/158 |
| 2006/0146600 A1 * | 7/2006 | Johnson ............ 365/163 |

* cited by examiner

*Primary Examiner* — Hoai V Ho
*Assistant Examiner* — Anthan Tran
(74) *Attorney, Agent, or Firm* — Trop, Pruner & Hu, P.C.

(57) ABSTRACT

A read current high enough to threshold a phase change memory element may be used to read the element without thresholding the memory element. The higher current may improve performance in some cases. The memory element does not threshold because the element is read and the current stopped prior to triggering the memory element.

9 Claims, 6 Drawing Sheets

READING PHASE CHANGE MEMORIES

CROSS-REFERENCE TO RELATED APPLICATIONS

This application is a divisional of U.S. patent application Ser. No. 12/354,425, filed on Jan. 15, 2009, now U.S. Pat. No. 7,936,584 which is a divisional of U.S. patent application Ser. No. 11/093,878, filed on Mar. 30, 2005, which issued as U.S. Pat. No. 7,495,944.

BACKGROUND

This invention relates generally to semiconductor memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile, absent application of excess temperatures, such as those in excess of 150° C. for extended times. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

The memory cells can be selected for a reading operation, for example, by applying suitable voltages to the respective word lines and suitable current pulses to the respective bit lines. A voltage reached at the bit line depends on the resistance of the storage element, i.e., the logic value stored in the selected memory cell.

The logic value stored in the memory cell is evaluated by using sense amplifiers to detect a difference in voltage and current reflecting the state of the memory. Typically, a sense amplifier includes a comparator receiving the bit line voltage, or a related voltage, and a suitable reference voltage for comparison to the level from the memory, after a period. For example, where the bit line voltage is higher than the reference voltage after a period of time, the memory state stored is described as a reset or logic value "0", whereas in the case in which the bit line voltage is lower than the reference voltage, the stored logic value is described as set or a "1".

The access element can consist of a threshold switch made of a phase-change material, similar to the storage element serially connected thereto. This element switches (without changing its phase) from a high-resistance condition to a low-resistance condition when a voltage applied thereacross exceeds a threshold value and reverts to the high-resistance condition when a current flowing therethrough falls below a minimum holding value. A voltage across the access element in the low-resistance condition has a substantially constant value (holding voltage) because the dynamic resistance dV/dI is relatively low so most of the voltage drop is a holding voltage, Vh. In this case, the matrix of memory cells can be advantageously provided without any transistor, and then using a single technological process.

During a reading operation, the read current pulse causes the charging of stray capacitance intrinsically associated with the bit line, and, accordingly, a corresponding transient of the bit line voltage on a selected bit line. If charged positively, the respective bit line voltage raises towards a corresponding steady value, depending on the logic value stored in the selected memory cell.

The transient of the bit line voltage depends not only on the stray capacitances associated with the bit lines, but also on operative parameters of the storage elements and of the access elements, such as impedance and threshold/holding voltages. Accordingly, robust sense amplifiers for memories based on a phase-change material preferably will allow a large variability in those operative parameters of the storage elements and of the access elements, varying also with temperature. A problem is that such a variability usually involves a reduction in a discrimination margin between the reference voltage and a value of the bit line voltage to be compared thereto.

Furthermore, a variability in the threshold voltage of the access element brings an uncertainty on a time in which the access element is switched on and then on a time in which the bit line voltage reaches a steady-state value to be sensed. Accordingly, such a variability has to be taken into account for the timing of a reading operation. Inevitably, the reading operation is slowed down, since the timing has to be based on the worst cases. Also, to preserve cell state and avoid a "read disturb" state change during read or mis-read, the voltage across the memory storage area is preferably maintained at less than a maximum voltage, such as the threshold voltage of the memory element $V_{TH}$ (oum). To avoid exceeding this maximum allowed voltage, the current applied to the column may be less than desirable for rapid column charging, increasing read delay.

Thus, conventionally, the current to read phase change memories is limited to less than the threshold current of the memory element, Ith(oum) or the voltage forced is limited to avoid applying a voltage across the memory element higher than its threshold voltage, Ith(oum). However these techniques may respectively increase undesirably the read access times and/or the possibility of exceeding a current that avoids programming a set bit (read disturb). One reason for this limitation of read current is to prevent triggering of the phase change memory element, which may require refreshing the bit to meet the expected data retention times. Such refreshing (re-write after read) is undesirable for increasing the read cycle time and reducing bit endurance related to write cycles.

If the current flowing through the selected memory cell exceeds a threshold current value, Ith(oum), for example a few microamperes, a heating by a Joule effect of the storage element is caused when the voltage across the oum snaps back from Vth to Vh due to displacement current related to driving the column voltage, which, consequently, can spuriously program the selected bit from reset to set (read disturb). In order to avoid spurious programming of the storage elements, for example, the maximum read current forced into a selected column can be limited to a value lower than the threshold current.

Such a small read current if less than Ith(oum) may involve a relatively slow charging of the bit line stray capacitances, which implies an increase of the time required for a reading operation. In particular, in the case the memory that is adapted to perform reading operations in a burst way, an initial latency, i.e., a time range between a first time in which a first address is provided to the memory and a second time in which the first data read is output, is increased. The request for faster and faster reading operation consequently prefers smaller and smaller initial read access delay latencies from when the selected address is provided the chip until the data is available on the output. Delays in charging the selected column due to use of low read current increases this delay latency until the data is available on the output.

A solution for decreasing a duration of the reading operation in the burst way is to increase the number of sense amplifiers of the memory, but this increases as well the power consumption and the related semiconductor occupied area of the memory which increases chip cost.

Thus, there is a need to improve read access time and/or margins for a higher performance phase change memory.

DETAILED DESCRIPTION

Figure 1:
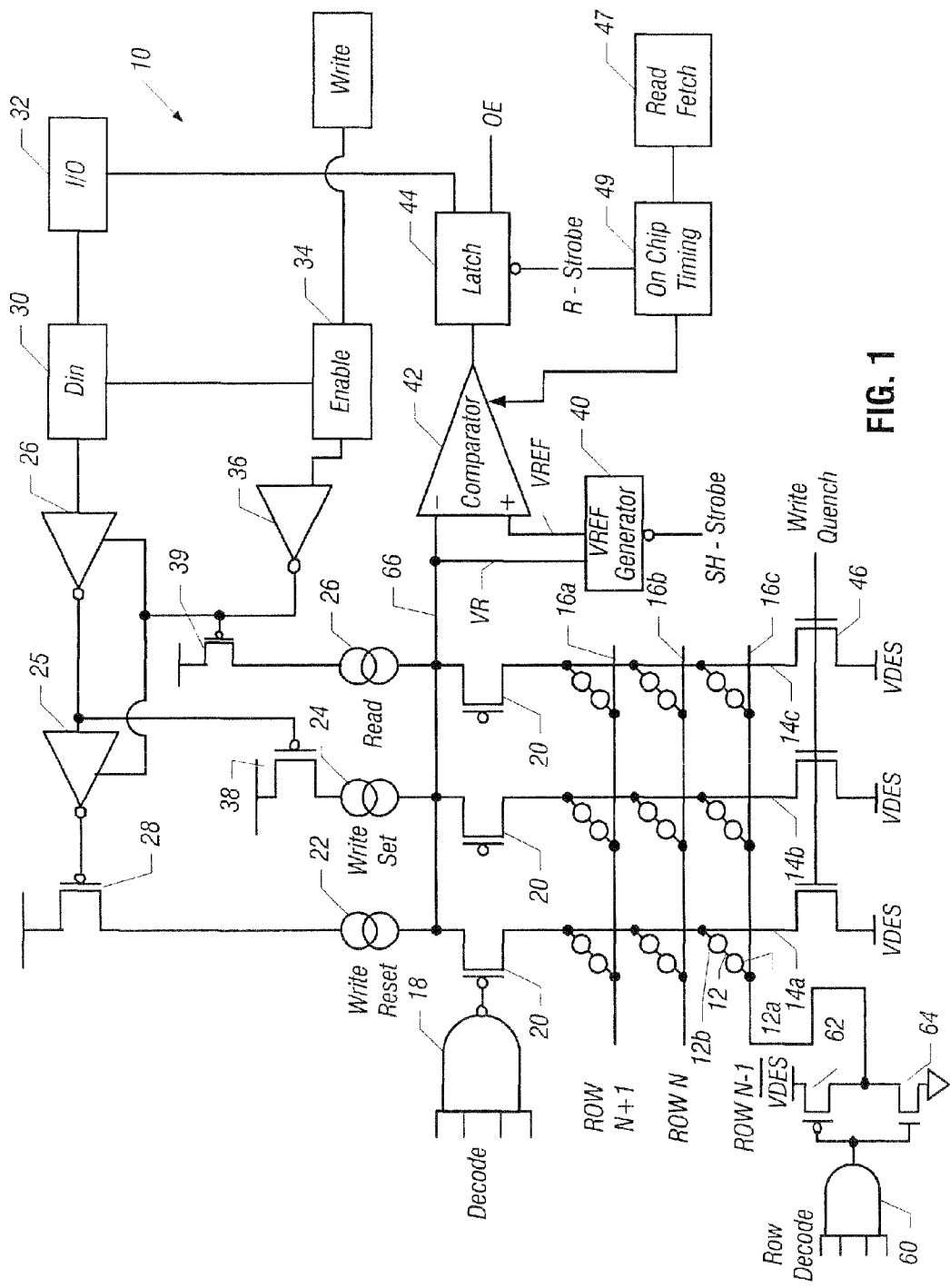
FIG. 1 is a circuit diagram for one embodiment of the present invention.

Referring to FIG. 1, a memory 10 may include an array of memory cells 12 arranged in rows 16 and columns 14 in accordance with one embodiment of the present invention. While a relatively small array is illustrated, the present invention is in no way limited to any particular size of an array. While the terms "rows" and "columns" are used herein, they are merely meant to be illustrative and are not limiting with respect to the type and style of the sensed array.

The memory also includes a number of auxiliary lines, useful for the operation thereof. In particular, the memory is provided with a supply voltage line distributing a supply voltage through a chip including the memory, that, depending on the specific memory device embodiment, may be, typically, from 1 to 3 V, for example 1.8 V. A further supply voltage line (such as a ground voltage line GND) distributes the ground voltage or a negative voltage. A high voltage supply line provides a relatively high voltage, generated by devices (e.g. charge-pump voltage boosters not shown) integrated on the same chip, or externally supplied to the memory; for example 4.5-5 V that may, for example, be helpful during write.

The cell 12 may be any memory cell including a phase change memory cell. Examples of phase change memory cells include those using a chalcogenide memory element 12b and a threshold device 12a that may be an ovonic threshold switch (OTS). A select or threshold device is an ovonic threshold switch that can be made of an alloy of chalcogenide that does not switch from an amorphous to a crystalline phase and which undergoes a rapid, electric field initiated change in conductivity, a change in conductivity that persists only so long as a holding current through the device is present.

In the case illustrated, a cell 12 includes an access, select, or threshold device 12a, as well as a memory device 12b which stores a bit of data. The threshold device 12a may have a reduced snapback voltage, such as 0.6V, as the difference between the threshold Vth(ots) and holding voltage Vh(ots). In one embodiment, that snapback voltage of the threshold device 12a (such as an OTS device) is less than the minimum threshold voltage of the memory element 12b by a reasonable margin that is adequate for reading with good margin a reset bit state without the voltage across the sensing device 12b exceeding its threshold voltage when the select device 12a thresholds (triggers after the current exceeds Ithreshold). Upon thresholding, the voltage across 12a snaps back from Vth (threshold voltage) to Vh (holding voltage), a difference that may be less than Vth(oum) of the memory element 12b.

In one embodiment, the phase change material used in the sensing memory device 12b may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after the electrical power is removed.

In one embodiment, the phase change material may be chalcogenide element composition from the class of tellurium-germanium-antimony ($Te_xGe_ySb_z$) material or a GeSbTe alloy, such as 2,2,5, although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information.

Programming of the memory material to alter the state or phase of the material may be accomplished by applying voltage potentials or forcing current into or out of the selected lines 14, 16, thereby generating a voltage potential across the memory material. An electrical current may flow through a portion of the memory material in response to the applied voltage potentials and current forced, and may result in heating of the memory material.

This controlled heating and subsequent controlled cooling may alter the memory state or phase of the memory material. A slow trailing edge of the write pulse on the column to row voltage difference assists in crystallizing a bit into the "set" state. Fast reduction in the column to row voltage difference across the memory cell after applying write current or voltage better assures amorphizing the bit into the "reset" state.

Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 12b adjacent to either the top or bottom electrode may be phase changed during the write operation). In one embodiment, primarily the portion of memory material that undergoes phase change is the region that is adjacent to the smaller, more resistive lower electrode. The memory material may also be referred to as a programmable resistive material or simply a programmable resistance material.

In one embodiment, a voltage pulse with a potential difference of about 1.5 volts may be applied across the memory material by applying about 0 volts to a lower line (e.g., a row 16) and forcing a current, such as 2 ma, into the upper line (e.g., a column 14), so that more than 1 V develops across the memory element 12b after the select element 12a (in FIG. 1 or FIG. 3) is activated or triggered into a low impedance state. A current flowing through the memory material in response to the applied voltage potentials may result in heating of the memory material. This heating and subsequent cooling may alter the memory state or phase of the material.

In a "reset" state, the memory material may be in an amorphous or semi-amorphous state. In a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted, such as referring to a reset bit as a logic "0" and a set bit as a logic "1."

Due to electrical current, the memory material may be heated to a relatively higher temperature and then subsequently cooled at a fast rate to amorphisize memory material and "reset" memory material, such as by using the quench transistors 46 in FIG. 1. Heating the volume or memory material to a relatively lower crystallization temperature may crystallize and "set" the memory material, using a lower current or a slow trailing edge.

Various resistances of memory material may be achieved to store information by varying the amount of current flow and duration through the volume of memory material, or by tailoring the edge rate of the trailing edge of the programming current or voltage difference pulse from column to row (that may impact the cooling quench rate of the selected memory element). For example, a slow trailing edge which may be more than 100 nsec will tend to assist setting a bit, whereas a trailing edge rate that may be less than 10 nsec fall time will tend to reset a bit.

The information stored in memory material may be read by measuring the resistance of the memory material. As an example, a read current may be provided to the memory material using opposed lines 14, 16 and a resulting read voltage across the memory material may be compared against a reference voltage using, for example, the sense amplifier 42. The read voltage may be proportional to the resistance exhibited by the selected memory storage device 12b.

In a low voltage or low field regime, the device 12a is off and may exhibit very high resistance in some embodiments. The off resistance can, for example, range from 50,000 ohms to greater than 10 gigaohms at a bias of half the threshold voltage. The device 12a may remain in its off state until exceeding a threshold voltage or until a current greater than threshold current switches the device 12a to a highly conductive, low resistance on state. The voltage across the device 12a after turn on drops to a slightly lower voltage, called the holding voltage $V_{HOTS}$ and remains very close to this holding voltage almost regardless of current flowing, since the dynamic resistance is low, frequently less than 1000 ohms (now in series with its holding voltage). In one embodiment of the present invention, as an example, the threshold voltage of the device 12a may be on the order of 3 volts and the holding voltage may be on the order of 2.5V volts, where the difference may be less than the threshold voltage of the memory storage material, Vthoum.

After passing through the snapback region, in the on state, the device 12a voltage drop remains close to the holding voltage as the current passing through the device is increased, even if up to a relatively high, current level. Above that current level, the device remains on but displays a finite differential resistance with the voltage drop increasing with increasing current. The device 12a may remain on until the current through the device 12a is reduced below a characteristic holding current value that is dependent on the area of the material and the holding voltage may be affected by the choice of top and bottom electrodes utilized to form the device 12a.

The snapback voltage of the device 12a may be reduced to be less than the threshold voltage of the memory element 12b, Vthoum, to avoid triggering a reset bit as it is selected, such as by raising the column 14 and lowering the row 16. The snapback voltage is the threshold voltage minus the holding voltage of the threshold device 12a. The threshold voltage is where the dynamic resistance of the device switches from high to low. In one embodiment, the snapback voltage of the device 12a of about 0.5V is less than half the minimum threshold voltage of the memory element 12b of about 1V. In another embodiment, the snapback voltage is less than the minimum threshold voltage of the element 12b minus about 600 mV. If necessary to improve margin against triggering a reset bit, the reset bit current used may be increased on-chip above the minimum necessary reset current to increase the 12b memory element threshold voltage, thus improving margin against triggering the reset memory bit(s) during read. For example, if during operation of the memory in the field, excessive error correcting (Hamming) code (ECC) errors are detected, the write current may be increased in increments of, for example, 10% until ECC errors are reduced.

Or, the reference voltage used for read may be indexed up. Then, after writing a bit to the reset date, the bit may be read to confirm that the bit does not threshold. If instead, the bit thresholds, the reset current may be increased some amount, such as 10%, and the bit rewritten until it can be read with the higher reference voltage without thresholding. Current may be increased in 10% increments until some upper limit is reached (such as 2× normal current), and then bit or block may be logged as bad. For another rewrite cycle, another bit may be used with a transposed address. Or the block may be rewritten to another block, using for either approach techniques which are familiar to those skilled in the art.

The snapback voltage of the threshold element (OTS) 12a may be reduced by reducing the threshold voltage and/or increasing the holding voltage. The threshold voltage may be reduced, for example, by reducing the thickness of the switching material, and/or altering its composition. The holding voltage may be increased, for example, by changing the type or composition of electrodes that apply a potential across the switching material. Or, for example, to obtain Vth at a high voltage with reduced Vsnapback, Vh may be increased by placing several lower Vth select devices 12a in series within the memory cell.

In some embodiments of the present invention, the threshold device 12a does not change phase. It remains permanently amorphous and its current-voltage characteristics may remain about the same throughout its operating life.

As an example, for a 0.5 micrometer diameter device 12a formed of TeAsGeSSe having respective atomic percents of 16/13/15/1/55, the holding current may be on the order of 0.1 to 1 micro-amps (uA) in one embodiment. Below this holding current, the device 12a turns off and returns to the high resistance regime at low voltage, low field applied. The threshold current for the device 12a may generally be of the same order as the holding current. The holding current may be altered by changing process variables, such as the top and bottom electrode material and the chalcogenide material, and/or the contact area between the electrodes and chalcogenide. The device 12a may provide high "on current" for a given area of device compared to conventional access devices such as metal oxide semiconductor field effect transistors or bipolar junction transistors or semiconductor diodes. However, such devices may also be used in some embodiments, as shall be apparent to one skilled in the art as an adaptation of the embodiments and descriptions herein.

A decoder 18 in FIG. 1 (or 3) receives address signals to select the desired column using transistors 20 uniquely associated with each column for cell selection. A reset write current source 22 is coupled to node 66 in parallel with a set write current source 24 and a read current source 26. The read current may exceed the threshold current of the memory element 12b and be set to generate a fast rise time on the selected column (14a or 14b or 14c, with selection determined by the "on" select transistors 20a or 20b or 20c). The current sources are coupled to selected columns as needed in response to addressing commands from an external memory user such as a processor. A set of transistors 46a or 46b or 46c may be located on the bottom of the columns 14 in order to enable write quenching and deselect by assuring fast write current pulse trailing edge on columns 14. Fast quench is also assisted by simultaneous switching of the row from select to deselect voltage. Alternately instead of a read current source, a voltage may be forced which is about equal to VREF and the compliance limited to the read current (here for example, 50 ua). Then, if the current driven after the transient dies out is greater than Iread, the bit is set. Otherwise, the bit is reset. By such techniques, the current forced can be greater than Ith (oum) of 12b, yet the device is not thresholded.

Transistors 28, 38, and 39 are on/off switches that select the desired current, generated by current source 22, 24 or 26, to the selected column 14 depending on whether the function desired respectively is to write a bit to its reset state, or write to the set state, or read the selected bit. A gate 36 either disables read by enabling write Din gates, or turns on transistor 36 to enable the read current source 26. Unless enabled, gates 25 and 26 turn off the write current sources, 22 and 24. The gate 36 is controlled by enable circuit 34. An input/output (I/O) control 32 is coupled to the data in (Din) circuit 30, which is coupled to select either write 0 or write 1 through selection of either current source 22 or 24, one having less write current to write a 1 (and crystallize) than the other that resets the selected bit to a 0 (amorphous). The Data-in circuit 30 is write enabled by 34 through gate 36.

A sense amplifier 42, in the form of a comparator in one embodiment, receives one input from a selected column, for example 14c, being read. The sense amplifier 42 may optionally include a pre-charge circuit to pre-charge node 66 and the selected column of columns 14a, b or c to a pre-charged voltage by means apparent to one reasonably skilled in the art. The sense amplifier 42 and reference voltage generator 40, which may force a voltage that stays relatively fixed during the read cycle, may be provided on each column 14 in one embodiment, but more preferably, as shown, is shared across an array of column lines to minimize related layout area. The on-chip timing 49 for the sense amplifier 42 and data output latch 44 may provide an output enable (OE) signal as an option which at least indicates when the output can be driven, though usually OE is also furnished by the processor to enable the output driver to a low impedance state (once the data is ready from the read cycle) to avoid bus conflict such as to and from the processor if Din is on the same pin as Dout.

The output signal from the latch 44 is controlled by a read (R) strobe in that the whole read fetch cycle is started by the equivalent of a read signal, again usually furnished by a processor. Alternatively, this signal may be generated on-chip by sensing an address change when write is not selected.

The reference generator 40 produces a reference voltage VREF which may be higher than a column voltage driven by a set bit but lower in voltage than a column driven by a reset bit, a column voltage that may be clamped or limited to force across the memory element 12b less than the threshold voltage, and the voltage clamp may preferably be lower than this voltage for margin, such as by 0.5V. The set state corresponds to a lower resistance value and the reset state corresponds to a higher resistance value. Approximately, VREF may be set at the voltage on the selected column 14 above the holding voltage of the device 12a (e.g., about 2.5V) plus two-thirds of the approximately 1V threshold voltage of the device 12b, for a total of about 3.2V, to provide reasonable margin between the one and zero states of the cell.

However, here the set bit may be detected indirectly. A reset bit has a high resistance times a relatively high read current such as 50 microAmps, so if allowed to charge indefinitely, the voltage across the device 12b alone would be 5V or greater for a 100K or greater reset bit. However, once the column of the reset bit exceeds VREF, the current is turned off, stopping further charging to avoid triggering the reset bit. This also signals that the bit is a one (reset) which is latched and sent to the output.

Figure 2A:
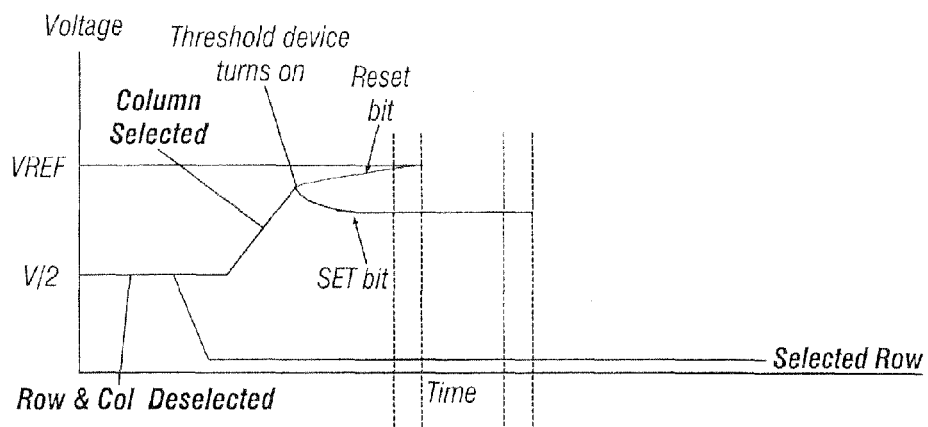
FIG. 2A is a theoretical depiction of voltage versus time for a selected column in accordance with one embodiment of the present invention without using actual data.
Figure 2B:
FIG. 2B is a theoretical depiction of the read current driven into the selected column versus time in accordance with one embodiment of the present invention without using actual data.
Figure 2C:
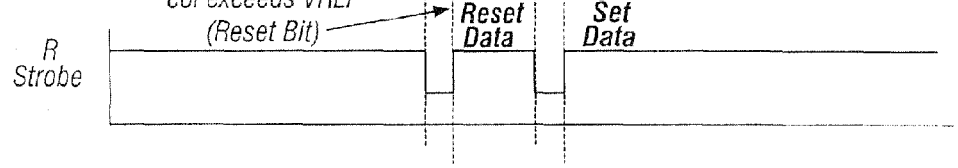
FIG. 2C is a theoretical depiction of the read strobe data latch voltage versus time in accordance with one embodiment of the present invention without using actual data.

In contrast, a set bit may have a voltage across memory element 12b less than 0.5V (column voltage less Vh(ots), here for example 2.5V). Thus, when reading a column with a selected bit in the set state, the column voltage either reaches VREF very slowly or not at all as indicated in FIG. 2A. Accordingly, for better margin, a timeout may be used that may begin when the column read cycle begins. If the column voltage exceeds VREF before the timeout ends, the bit is latched as reset and the current stops when the column reaches VREF. Otherwise, the bit is set and the current is stopped when the time-out ends (and before the column reaches VREF). With this approach, the comparator output is in the correct state for latching (low when the column exceeds VREF which triggers latching, and high if VREF is not exceeded by the timeout from the on-chip timing 49 which triggers latching if VREF has not earlier been exceeded). Shown in FIG. 2C are these two timing alternatives to latch reset data (the earlier negative going edge reflects the column reaching VREF) and the second position of latching data reflects time-out (because the column has not reached VREF due to accessing a set bit).

Figure 3:
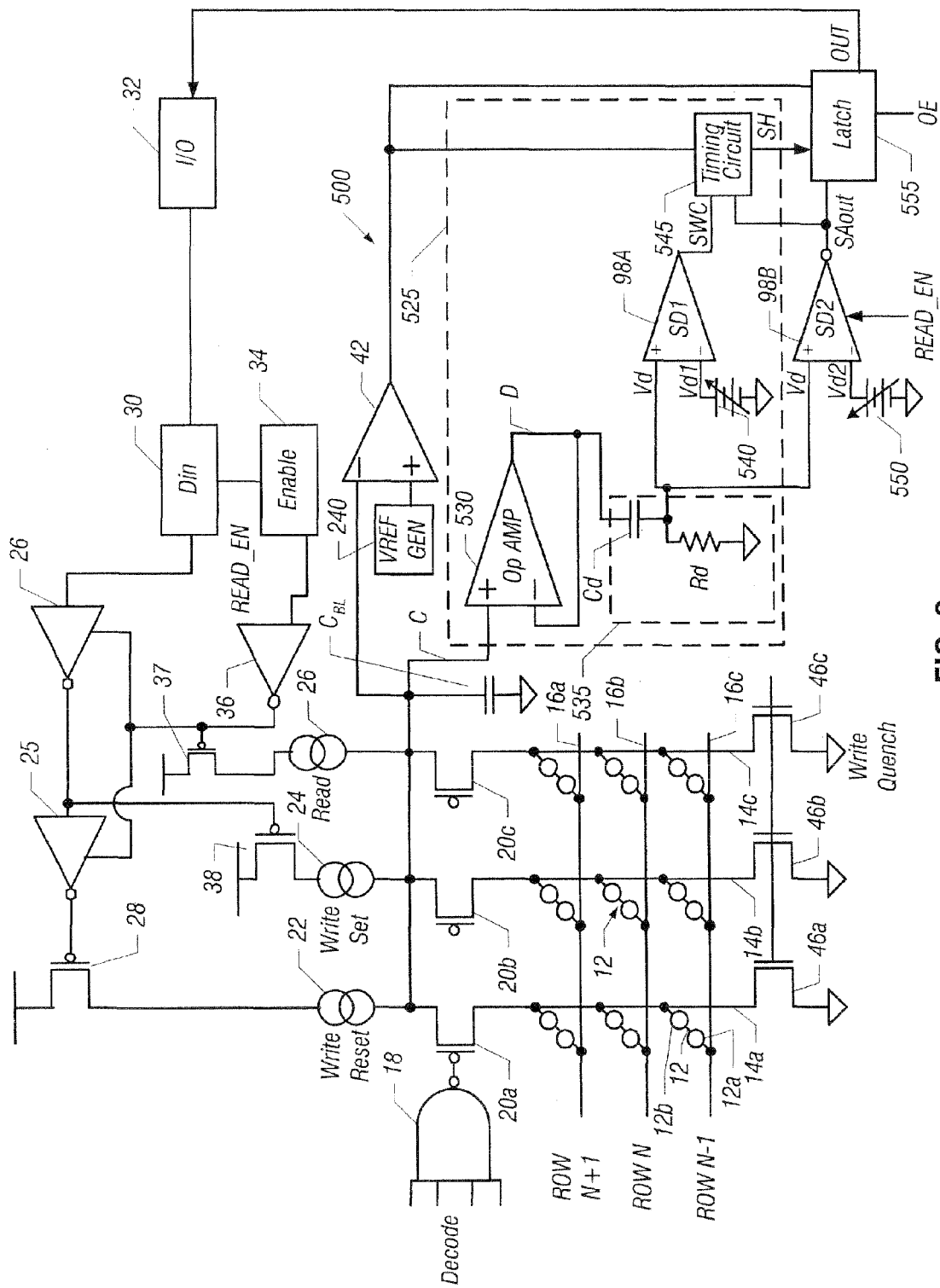
FIG. 3 is a circuit diagram for another embodiment of the present invention in which timing to stop the read cycle is generated by sensing a change in slope for charging the column line, thus detecting when the memory cell select element has triggered as the column charges to a more positive voltage.
Figure 4:
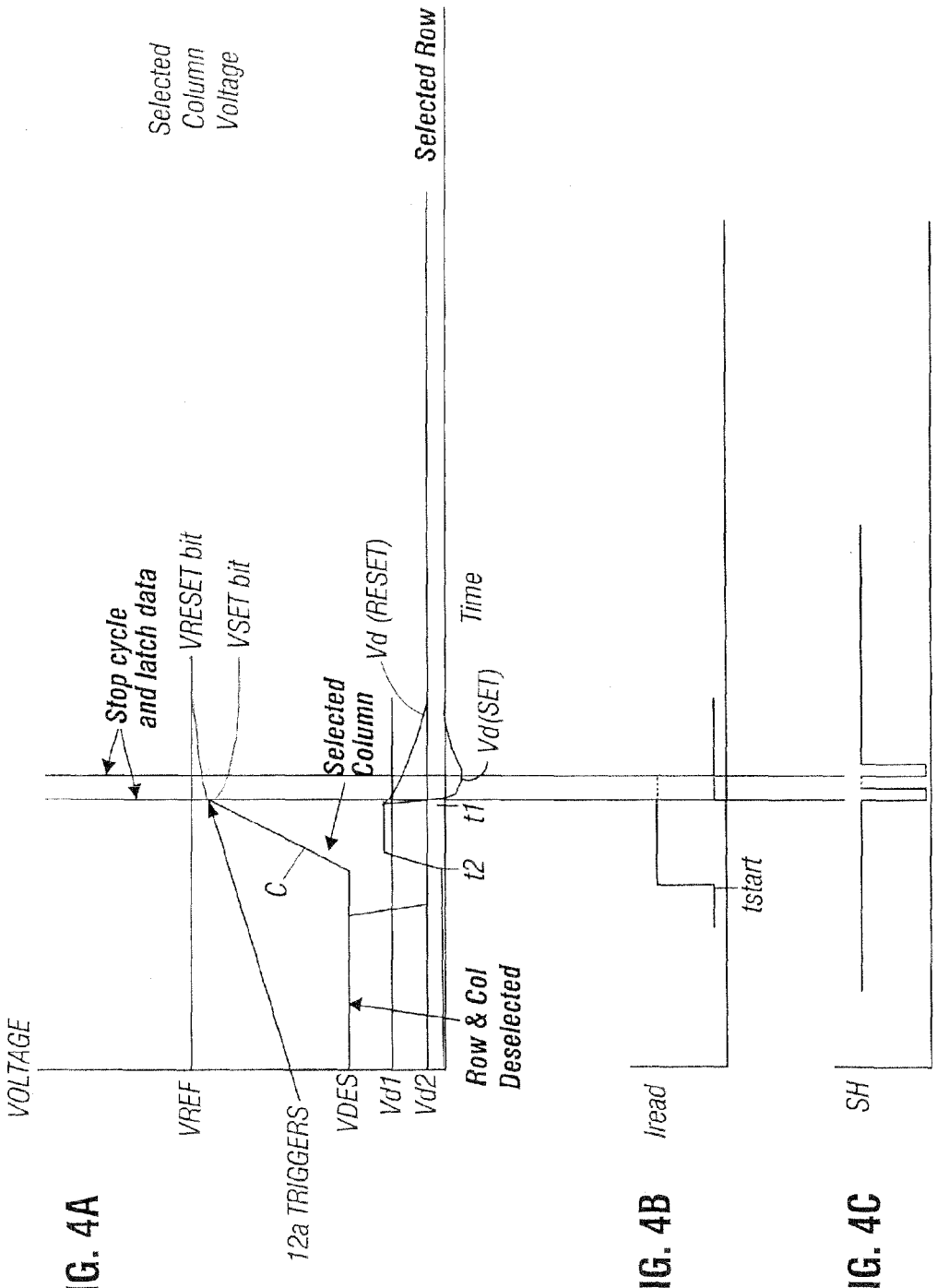
FIG. 4A is a theoretical depiction of voltage versus time for a selected column in accordance with another embodiment of the present invention without using actual data.
FIG. 4B is a theoretical depiction of the read current timing for the embodiment of FIG. 4A.
FIG. 4C is a theoretical depiction of the SH latch data signal versus time.

For better margin, the circuits of FIGS. 3 and 4 may be used which may create a more precise timeout in some embodiments. In FIG. 3, the rate of charging the column line is sensed with a rate detecting comparator SD1 not in FIG. 1. The set bit causes the rate to change so that the rate change may be detected and a timeout started more precisely to sense that a set bit has not allowed the column to exceed Vref. Alternatively, detecting the rate change may allow latching a one without a timeout for set state, with the cell state latched as set if the rate changes enough. As shown in FIG. 4A, the column driven by a selected set bit may cause the rate detector output to fall below 0V, for example, or below some appropriately adjusted reference voltage that is the other input to comparator SD2. If the rate changes enough to fall below the other input to SD1, the ots has triggered but the cell state may be either a set or reset bit (the decision triggered positively if the rate detector node falls below the reference to SD2 or the column exceeds VREF (or a timeout occurs).

Referring to FIG. 2A, the column voltage level over time is shown for a selected column and row in accordance with one hypothetical embodiment. In standby or when deselected, the column voltages are approximately equal to V/2, where V is related to the threshold voltages of devices 12a and 12b, and may be adjusted die to die by trimming using techniques familiar to those skilled in the art. For example, V may be about 4V or more if the threshold voltage of device 12a is typically 3V with Vh of 2.5V, and the threshold voltage of device 12b is typically 1V with Vh of 0.5V. Other biasing schemes with better voltage margin but increased standby leakage may be used, such as deselecting the columns to ⅓V and the rows to ⅔V when a block is active (and otherwise putting both to zero volts).

During selection of a cell for read or write, the selected column voltage goes high and the selected row voltage goes low. While deselected, row 16 has an initially higher voltage such as V/2, which falls rapidly, upon selection, to a steady low select voltage which may be near zero depending on row driver sizing and the amount of column current. The deselected column 14 has a relatively lower deselect voltage such as V/2 which may increase as the column is selected. The selected column voltage increases upon selection, as shown in FIG. 2A. FIG. 2B shows how the selected column current steps up to 50 ua for read, forcing the selected column voltage in FIG. 2A to rise after the column current is applied, as shown in FIG. 2B.

The read column current is greater than the threshold current of the threshold element 12a and may be greater than the threshold current of the memory element 12b, because, in the embodiment shown in FIG. 2A, the column charging is stopped before the voltage across the memory element 12b exceeds the threshold voltage of the memory element 12b.

As shown in FIG. 2A, the column 14 voltage may cross the VREF voltage after the threshold device 12a turns on, and in a relatively fast time if the bit is reset because, with the higher resistance in the cell, most of the read current charges bit line capacitance instead of being diverted into the cell if the bit is in the lower resistance set state. If the bit is set, the column 16 voltage may not cross VREF or does so much later, and preferably only after an on-chip adjustable timer 49 has timed out and the data has been latched as set or "1."

The timer 49 can be started at the beginning of the cycle when the read fetch cycle is requested and the column starts high. Or, the column can be timed out by a column charge rate sensor. Either the set bit changes the column charging rate substantially, signaling to latch the bit as set (to present to the output I/O), or the column reaches VREF, signaling to latch the bit as reset. Thus, the column current may be turned off before the memory element 12b triggers by comparing to VREF and stopping the read current if VREF is reached on the column during read.

VREF is a voltage set low enough to avoid applying more than a threshold voltage across the memory element 12b. Stopping the column voltage at or below VREF prevents a reset memory element 12b from thresholding and entering the dV/dI region, which could necessitate refreshing the bit periodically. Such refreshing involves rewriting the bit after reading it, to maintain its higher resistance state. Such refreshing adds to the read cycle time and reduces endurance.

Despite using a read current greater than Ithoum, the reset bit sense cycle may be terminated prior to memory element triggering in various ways. After a timeout delay from starting the column high, the read current may be turned off as the column voltage is compared to a reference voltage, checking to see if it is above or below. The timeout needs to be longer than the time necessary to trigger the select device 12a but less than the time necessary for a fully reset bit to exceed Vthoum after 12a triggers.

In one embodiment, fixed timing without feedback or sensing the column voltage may be used wherein the column has time to exceed a reference voltage and both are inputs to a comparator, with the output latched after the time delay. Though it is the simplest, this approach may suffer from variations column to column in the bit line capacitance and from bit to bit variations in the threshold of the select device 12. If the variations are enough, the time delay may be too fast so the column has not yet exceeded Vthots, suggesting a misread because the result is not affected by the memory cell resistance state. Or, the time delay may be too slow, allowing the column voltage to exceed both Vthots and Vthoum if the bit is reset. Hence, some feedback may be desirable to both sense the cell and prevent the column from exceeding Vthoum when the cell is in a reset state.

In another embodiment shown in FIGS. 1 and 2, the column voltage is compared to a VREF voltage. If exceeded, the column current can be stopped and the bit state determined and latched as reset (not necessarily in that sequence). A sense amplifier 42 may sense when the column exceeds the reference voltage and the device current can be cut off (as indicated in the bold vertical dashed lines in FIG. 2B) if the bit is reset. The data can be latched and output to the I/O pin 32 after the current is cut off (FIG. 2C). Otherwise, after allowing an additional time interval (such as 20 nsec.) from when the selected column starts high, if the reference voltage has not been exceeded, then the bit is determined to be a set bit. Here again, the current may be cut off (FIG. 2B) and a set bit is latched (FIG. 2C) and output to the I/O output pin 32.

In another embodiment, the reference voltage (VREF) may be added to the selected row using techniques familiar to those reasonably skilled in this art, for improved cell to cell margin along the row line. This technique may compensate for variations in ground drop and along the row line, where the row voltage is not pulled all the way to ground (and where the row line is intentionally not pulled all the way to ground to minimize row leakage to deselected columns). Such sensing could be done through a diode and circuit from the rows, or by simply using a representative row, or voltage along a representative row. Other variations such as this to improve margin are also possible, as will be apparent to those skilled in the art.

Preferably, the population of bits is scanned at the factory and the reference voltage is "programmed" into the chip so the reference voltage is relatively well centered so as to optimize for the variation in bits due to deterioration with use, temperature, and voltage variation in thresholds and holding voltage. Preferably, the reference voltage is adjusted block by block for larger size memories with more than one block on a chip, or even for segments of a block in larger blocks. The reference may be temperature and voltage compensated to better track cell margin.

In a multi-bit scheme for physical cells, multiple reference voltages can be created in a similar fashion. Writing varying resistance levels to a given cell may allow more than one bit per cell using techniques apparent to those skilled in the art, though the techniques described herein are for one bit per cell. For example, VREF1, and an additional VREF2 and VREF3 may be created and appropriately adjusted to allow sensing four different resistance ranges—thus storing two or more logical bits in one physical cell. By such techniques, more or less levels or bits may be stored and sensed in a physical cell, including through use of feedback/rewrite such as with a binary search.

For reduced access delay time and once VREF is exceeded when accessing a reset bit, the read current is stopped to avoid triggering the memory cell 12b. After triggering the select device 12a, the column voltage snaps to Vh and charges further from there. For low set cell resistances of less than 5,000 ohms and read currents of 50 ua, the voltage across the cell is primarily the select device 12b holding voltage since the voltage across the memory may be less than 0.3V as the column charges. Similarly, if the cell is reset, further capacitive charging continues from this ots threshold voltage, with the holding voltage plus voltage across the memory element 12 bas Vinitial, so the voltage at any later time is related to Vh(ots).

The circuit of FIG. 3 may be used to reduce sensitivity to Vhots and improve timing accuracy and read speed (compared to a fixed timeout), thus improving read delay and voltage margin during read in some embodiments. Here, the selected read column output C is buffered through an operational amplifier 530 so node D can drive inputs to two comparators SD1 And SD2 through a differentiating series $C_d$ and $R_d$ combination. One skilled in the art will find other alternatives and improvements to sense a change in the rate of charging the column, as are used in rate differentiators.

The sense amplifier and timing circuit 525 may include an operational amplifier 530 which provides an output voltage based on the voltage from the selected line 14c as indicated at C in FIG. 3. The output of the operational amplifier 530 may be fed back to its input as indicated at D in a manner so the output of 530 tracks its input. The output of the operational amplifier is also coupled to a capacitor Cd and a resistor Rd. Together, the capacitor and resistor produce a differentiated output Vd. Thus, the voltage Vd is essentially a rate of change derivative of the charging voltage C from the selected column line 14c.

The sense amplifier and timing circuit 525 may also include a comparator SD1 having a terminal that receives the differentiated column line voltage Vd. The comparator SD1 also receives a voltage Vd1 from an adjustable voltage source, 540. An output terminal of the comparator SD1 provides an output SWC that compares the adjustable voltage Vd1 and the voltage Vd. This signal may then be provided to a timing circuit 545. The timing circuit 545 may be enabled by a read enable signal READ_EN from the comparator SD2 and stopped by a signal SWC or by timing out internally.

The input to comparator SD2 is also coupled to the node Vd. The comparator SD2 is coupled to voltage source 550 which provides an adjustable voltage level Vd2. The comparator SD2 provides an output indicative of a comparison between the voltage Vd and a variable voltage Vd2 from the source 550. Sources 540 and 550 may be on-chip and generated using band-gap techniques to compensate appropriately for temperature and power supply variation using techniques familiar to those reasonably skilled in the art.

The voltage VD1 of the voltage source 540 may be selected to be lower than a maximum value reached by the derivative voltage Vd. The voltage VD2 of the voltage source 550 may be selected to be suitably lower than the voltage of the source 540, and may be near zero Volts. The output SAout of the comparator SD2 may be coupled to a latch 555 that stores an output signal when enabled by the Read_EN (read) strobe signal from the timing circuit 545 through line SH. The timing circuit 545 provides the strobe signal SH to the latch 555 according to the outputs from the comparators SD1, SD2, and 42. For example, the bit may be reset and 0 may be latched (and read current stopped) if either: the column voltage exceeds VREF, or the output of SD1 switches because the rate of change causes Vd to exceed Vd1 and then fall below it, but VD does not fall below Vd2 after a brief timeout, such as about 10-20 nsec (so the bit is latched as a reset bit).

The output of SD1 switches high and then low because the rate derivative voltage Vd exceeds Vd1 and then falls below it (which happens for both a set and reset bit). Then SD2 may switch because Vd also falls below Vd2. The bit is latched as a set bit "1" (and read current stopped) if the column does not exceed VREF after a timeout, or if the output of SD2 switches because Vd exceeds Vd1 then falls below Vd2 because of an adequate change in rate slope of column charging (and then discharging) because the bit is set.

Referring to FIG. 4A, during a read operation, a transient column line voltage first increases from the de-selection voltage, time t2, towards a steady state (selected column) Vfinal, depending on the logic value stored in the selected memory element 12b.

At a switching time, t1, the threshold device 12a thresholds (triggers), rapidly decreasing the voltage across it from Vthoum to Vhoum. Some or all of the voltage difference is then across the memory element 12b. In the case where a set bit is stored in the memory element 12b, the line 14c voltage slows substantially or even starts decreasing towards a lower steady state voltage. In the case where a reset bit is stored, the line voltage, depending on the resistance of the bit and also on the select device 12a's snapback voltage Vsnap, increases with a lower rate towards a steady state value well above the value of a set bit, and may be stopped when the column exceeds VREF.

The derivative voltage Vd corresponds to the gradient of the line voltage. Accordingly, at the time t2, when reading is initiated, the derivative voltage Vd starts increasing from zero and promptly levels out until the time t1 when the device 12a triggers.

When the memory element 12b stores a set bit, after t1 the derivative voltage Vd decreases rapidly, and may even become negative. When the selected 12b memory element is set (low resistance), the voltage on the selected column line rapidly approaches a steady state value since the RC is much lower, and so the derivative voltage goes to zero volts. Thus, Vd may first exceed Vd1 and Vd2, and then fall below both before stabilizing at 0 volts until the read current is turned off when the read cycle closes.

In the case where the memory element 12b stores a reset bit, after t1, the derivative voltage Vd (reset) decreases to less than the peak voltage achieved by Vd but stays higher than minimum voltage Vd (set) during read of a set bit. After t1, the reset voltage on the line 14c still may increase but with a lower gradient, and may even decrease depending on the read current times the cell reset resistance relative to Vsnap of the select device 12a.

Because of the higher resistance of the reset bit (RC much greater), the reset steady state Vfinal is approached more slowly than the set voltage steady state Vfinal. Accordingly, the reset derivative voltage Vd(reset) may decrease after 12a thresholds, but not as much as for a set bit.

The derivative voltage Vd first exceeds and then drops below the first voltage Vd1 from the source 540 (FIG. 3). The output from the comparator SD1 is initially at a low value, and switches to a high logic value after the read current is started. Then, comparator SD1 switches to a low logic value when the threshold element 12a has triggered because the rate of increase in the column voltage decreases because the dynamic impedance into the column the cell is less after the select device switches, decreasing Vfinal, and hence the charging rate of the column—thus lowering Vd. The output signal from the comparator SD2 is initially at a high logic value until the derivative voltage Vd is greater than the voltage Vd2 of the voltage source 550, a voltage lower than Vd1.

When the derivative voltage Vd drops below the voltage Vd2 of the voltage source 550, in the case of a set bit, the output signal of the comparator SD2 again switches back to a high logic value. Then, the timing block receives a positive going switching control signal from the comparator SD2. Accordingly, the timing circuit 545 asserts the timing signal SH and enables the latch 555 to store the value of the output signal from the comparator SD2, if now high, as a set bit.

Otherwise, after a predetermined time-out period, (such as 10 nanoseconds) from t1, when the threshold device 12a has triggered, the output signal of the comparator SD2 is still at a low logic value and the timing block 545 enables the latch 555. The latched value from the latch 555 corresponds to the logic value stored in the selected memory element 12b, and is entered as a 0 because the bit is not set. Or the column may reach VREF, which should also trigger latching a zero and closing the read cycle by stopping the column current.

Detecting the switching of the threshold element 12a may appropriately limit the read timing, delay, and duration of the read current pulse. Particularly, in some embodiments, the column 14c voltage may be sensed before reaching a steady state, improving speed and allowing use of a current greater than Ithoum. In some embodiments, using a current pulse having an amplitude substantially equal to or greater than the threshold current of the memory element 12b may improve read delay. In some embodiments, the duration of the pulse can be limited so as to reduce spurious programming of memory elements 12b by avoiding more than Vth being applied across a reset bit.

As shown in FIG. 4A, the column node C goes high and then slows down or declines once the device 12a triggers. For a set bit, node D (FIG. 3) stops or declines slightly depending on the amount of 12a select device snapback voltage and IR drop in the 12b memory when the device 12a triggers. For a reset bit, node D increases but with a slower edge rate as compared to before the device 12a triggers. This edge rate is sensed by the differentiator and reflected in the output Vd.

With adjustment in the charging rate of the column (by adjusting read current magnitude), Vd(reset) for a reset bit may decline below Vd1, but remains above Vd2 after 12a thresholds. In contrast, Vd(set) for a set bit declines below both Vd1 and Vd2 (or even goes negative) and trips the comparators SD1 and SD2 after 12a thresholds. This comparator output Vd1 may more optimally be used to start "timeout" the data strobe using timing circuit 545 instead of other timeout approaches or voltage sensing of VREF, and thus start latch 555 as compared to a fixed timeout approach, to detect set. So, data is latched shortly after the column exceeds the select device threshold voltage without waiting to see if the VREF is exceeded by the voltage C (or not exceeded). The reference voltage, VREF into comparator 42, if exceeded, signals that the bit being read is reset (or set if not exceeded after an appropriate timeout).

This embodiment of FIGS. 3 and 4 may be further enhanced by using a peak detector on the rate detector output voltage Vd. The peak detector allows comparison of the column rate of change relative to a peak rate of change during reading the bit to find how much the column rate of change has decreased relative to peak Vd, as will be apparent to those reasonably skilled in the art.

Figure 5:
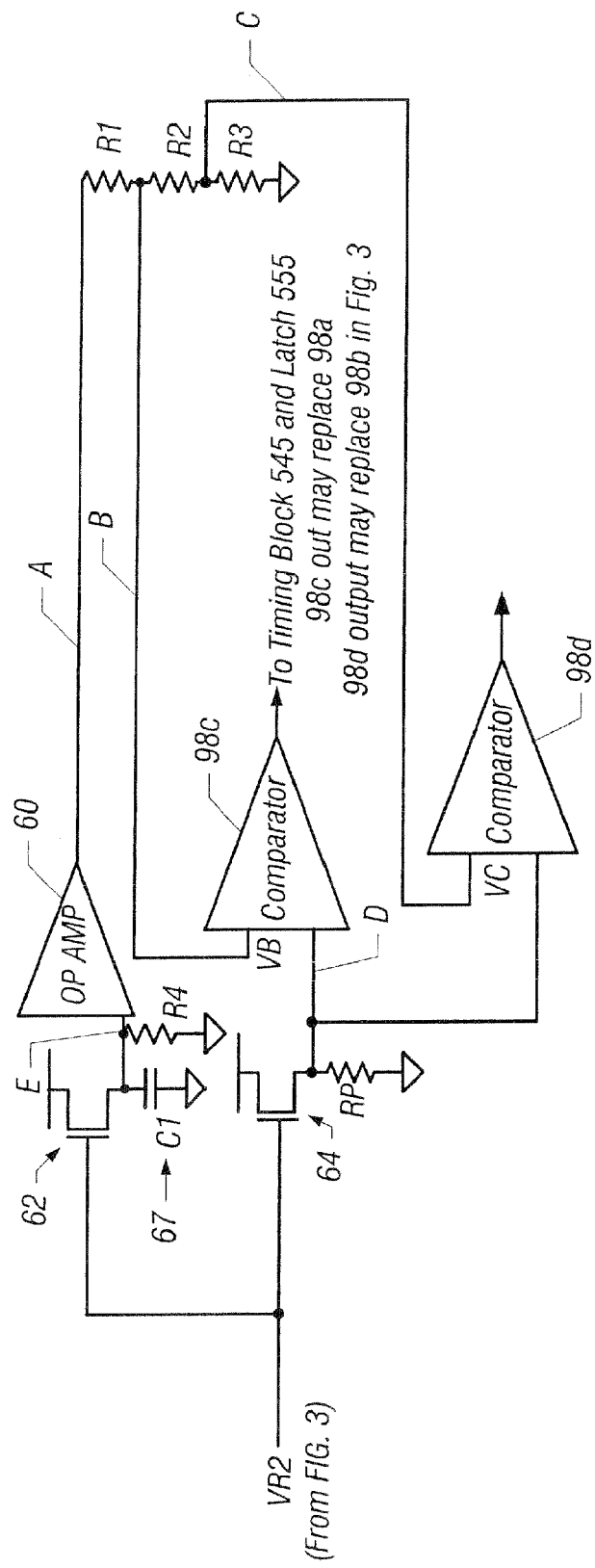
FIG. 5 is a circuit diagram for another embodiment of the present invention in which a peak detector helps set tracking reference inputs to the comparators in FIG. 3.

In FIG. 5, the comparators SD1 and SD2 are replaced, and their inputs instead drive a source follower 64 into the comparators 98c and 98d that sense (follow) the selected column node charging rate, Vd. Also, another source follower 62 creates a similarly translated peak rate of change voltage. This voltage may be buffered through a unity gain operational amplifier 60 and level translated by a resistor or capacitive divider that creates lower voltages B and C. A relatively high value resistor $R_4$ is coupled in parallel with the capacitance $C_1$ to reset the node between read cycles, the resistance set to have an R4C1 delay of about 200 nsec.

In FIG. 5, the peak is detected on C1. The voltages D and E are driven by transistors 62 and 64. Additional n-chan transistors may be added to drive the source of each of these transistors to ground at the end of the cycle, to reset the nodes until the next read cycle.

The output of source follower 62 is buffered by an op amp 60, which in turn drives a resistor divider R1, R2, and R3, creating respectively lower voltages B and C. R1, R2, or R3 may be trimmed using, for example, laser fuse repair techniques. Intermediate nodes B and C are dynamically adjusting reference inputs to comparators 98c and 98d that track with the peak of Vd, reflected at E and A. Comparators 98c and 98d perform a similar function as SD1 and SD2 in FIG. 3. However, the reference DC voltages 540 and 550 in this other embodiment are replaced with dynamically adjusting reference levels B and C respectively. For example, B and C may be instead routed to SD1 and SD2 (instead of Vd1 and Vd2), for the operation in the FIG. 3 embodiment.

As in a comparison to fixed voltages Vd1 and Vd2 in FIG. 3, in the FIG. 5 embodiments, the rate of change is compared to voltages during the read cycle. Initially, the column charges positively at the fastest rate because, until the select device 12a triggers, the resistance of the selected cell is highest. With highest resistance, most of the read current charges capacitance and establishes the fastest possible rate of change on the column. This peak rate of change is detected, translated, and stored during the rest of the read cycle on the input to op amp 60, node E, and similarly on buffered node A. R4C1 can be driven up in voltage relatively fast. However, R4C1 is large enough compared to the active portion of the read cycle so E decays down slowly, slow enough so that the peak established declines in voltage very little during the rest of the read cycle after the peak is reached.

After the device 12a triggers, the bit is reset if the rate of charging the column declines little compared to the peak sensed. For this case, the input D to comparators 98c and 98d may thereafter fall below VB but not below VC. By using a peak detector, B may be set relatively much closer to this peak rate of change VE stored on A. Any bit-to-bit variables such as selected column bit line capacitance affect the peak much as they affect the rate of charging after a select device 12a triggers. Accordingly, with a peak detector used to set the reference voltages equivalent to Vd1 and Vd2, the comparison of a reset bit rate of column change may be more accurately compared to the peak rate of change to better decide when select device 12a triggers.

If the bit is set, D will fall below both voltage B and C after select device 12a triggers because the change in resistance before after device 12a triggers will be greater for a set bit than a reset bit. With more accurate setting of the peak rate of change by sensing and storing it, both levels B and C can be set closer to the peak rate of change and yet assuredly less than the peak rate of change due to the improved accuracy in setting the levels relative to the peak rate.

Node D tracks the selected column line up and down, translated for Vgs. Sensing a slow down in the rate of the column charging can be used to timeout the column to latch the data and close the read cycle. For example, if node D input to comparators 98c and 98d first rises above and then falls below both voltages B and C, the bit is set and the cycle may close when the node is below C. Similarly, after node D exceeds and then falls below B, a timeout may be started. In a short period thereafter, such as 10 nsec, the cycle may close if the node D has not fallen below node C and the data may be latched as reset. This latter approach helps assure that VREF is not exceeded, and may be even be used by those reasonably skilled in the art to eliminate VREF. However, to better use this approach, increased snapback voltage in select device 12a may be preferred relative to the IRset, and the threshold voltage of the element 12b may be increased if more Vots snapback is increased, such as by increasing the thickness of the device in processing.

Thus, the circuit of FIG. 5 may act as a peak detector to more precisely start the timing for the circuit of FIG. 3. And, the circuit may be used to determine cell state without using a VREF, while still assuring that the column voltage does not place more than Vth across the memory sensing material 12b, such as when it is reset in a higher resistance state.

The peak detector of FIG. 5 may further refine the sensing of the rate change, by sensing a substantial decline from the peak of the rate detector output voltage of op amp 60 by the circuit in FIG. 5. The decline occurs when the select device threshold is exceeded so the select device 12a switches from Vth across it towards a lower voltage Vh, or at least the series combination of resistance of devices 12a and 12b declines when 12a thresholds "on."

Any decline is more precisely sensed relative to peak (instead of on an absolute basis affected by variation in Vh, dV/dI, etc). If a substantial change in slope does not quickly occur within a time-out after selected column charging starts (t2) or very quickly (such as after a few nanoseconds) after the select device switches (t1), the data may be latched as reset and otherwise as set.

By use of a peak detector, variations in resistance of select device 12a or bit line capacitance may be better accommodated in some embodiments. That is, the rate of initial charging the column is self adjusting bit by bit. Hence, the peak voltage on C1 is sensed and stored for reduction by a voltage divider to create voltages B and C in FIG. 5 that are equivalent in use to 540 and 550 in FIG. 5. Using dynamic voltages may improve margin in sensing when the select device turns on, and better assuring detection when the bit is set with the potential for reduced read access delay by not having to time-out to sense a set bit.

To further insure that Vth(oum) is not exceeded through the column voltage charging to an excessively high voltage that may threshold a reset 12b memory, the voltage on the column may be sensed. If a voltage greater than a clamping VREF is reached, the read current may be stopped and the cell state latched as reset. This is an alternate time to strobe the latch instead of only waiting for the timeout when using the embodiments of FIG. 3 and FIG. 5. Also, this can be a further assurance in stopping the cycle if the bit is reset, rather than waiting only for a timeout from t2 or t1, using a peak detector or not.

Figure 6:
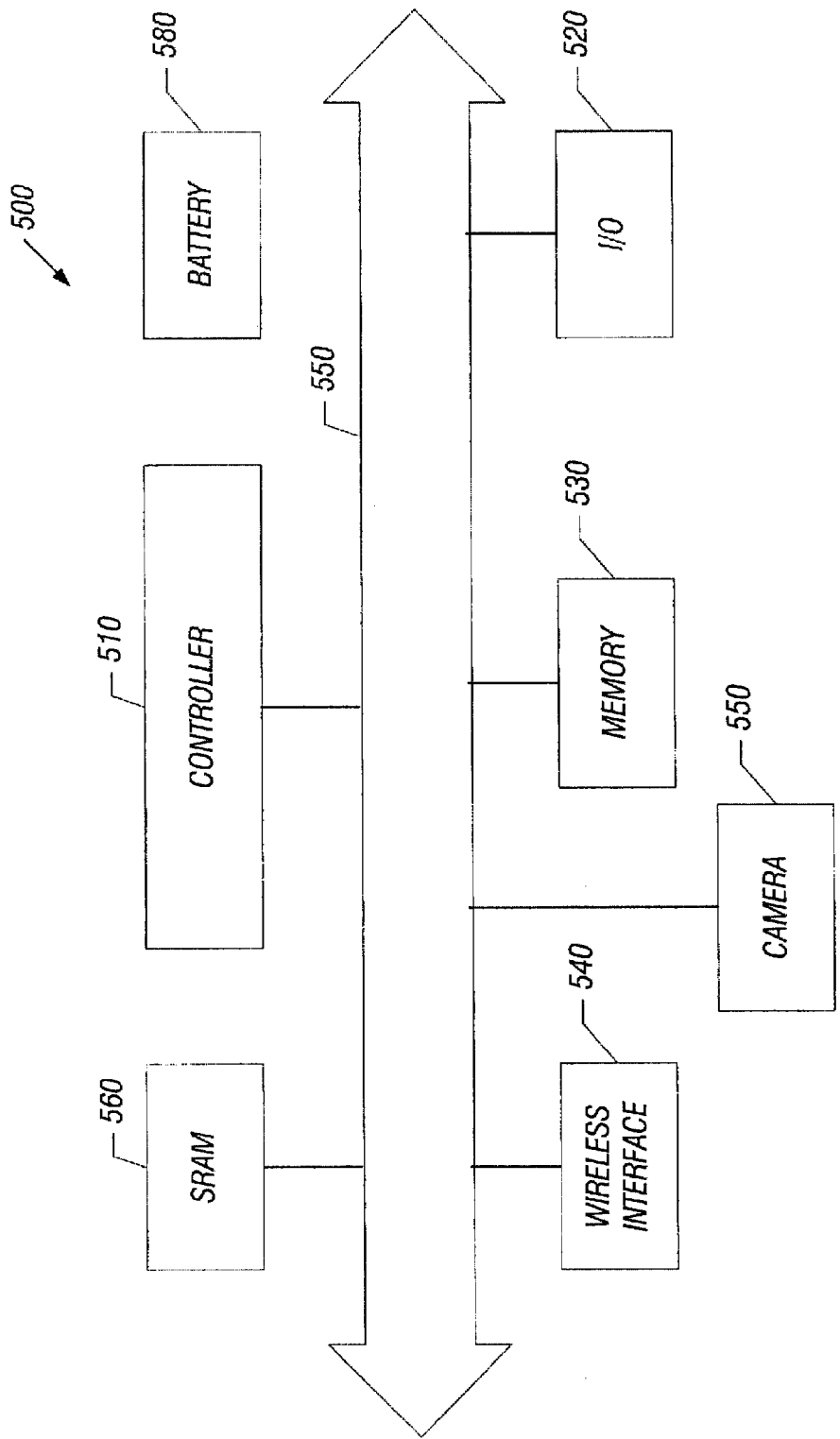
FIG. 6 is a system depiction according to one embodiment of the present invention.

Turning to FIG. 6, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, a digital camera 550, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or memory 10 illustrated in FIG. 1, 3 or 5.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
    an array of phase change memory cells including an address line coupled to said cells;

a current source to drive said address line at a current above the threshold current of said cells; and a sense amplifier to sense said addressed line, said sense amplifier to sense said address line and reduce the current after sensing memory cell state before triggering the memory element.

2. The memory of claim 1 wherein said cell includes a nonprogrammable, chalcogenide select device in series with a phase change memory element.

3. The memory of claim 1 including a charging rate detector coupled to said address line.

4. The memory of claim 3 wherein the rate detector starts selected timing.

5. The memory of claim 3 wherein the change in rate is used to determine memory cell state.

6. The memory of claim 4 wherein a reference generator stores a reference level which is the peak rate of charging said addressing line during reading from said line.

7. The memory of claim 5 wherein said generator outputs the translated reference levels for comparison to the peak level.

8. The memory of claim 1 wherein said sense amplifier to sense whether the level on a selected address line is above or below a reference level.

9. The memory of claim 1 wherein said sense amplifier to compare the rate of change on an addressed line at two different times.

* * * * *